United States Patent
Shin et al.

(10) Patent No.: US 11,579,521 B2
(45) Date of Patent: Feb. 14, 2023

(54) REFLECTIVE TYPE BLANKMASK AND PHOTOMASK FOR EUV

(71) Applicant: S&S TECH Co., Ltd., Daegu-si (KR)

(72) Inventors: Cheol Shin, Daegu-si (KR); Jong-Hwa Lee, Daegu-si (KR); Chul-Kyu Yang, Daegu-si (KR); Gil-Woo Kong, Daegu-si (KR)

(73) Assignee: S&S TECH CO., LTD., Daegu-si (KR)

( * ) Notice: Subject to any disclaimer, the term of this patent is extended or adjusted under 35 U.S.C. 154(b) by 223 days.

(21) Appl. No.: 17/144,506

(22) Filed: Jan. 8, 2021

(65) Prior Publication Data

US 2021/0208496 A1 Jul. 8, 2021

(30) Foreign Application Priority Data

Jan. 8, 2020 (KR) .................. 10-2020-0002546

(51) Int. Cl.
*G03F 1/24* (2012.01)

(52) U.S. Cl.
CPC ..................... *G03F 1/24* (2013.01)

(58) Field of Classification Search
USPC .......................................................... 430/5
See application file for complete search history.

(56) References Cited

U.S. PATENT DOCUMENTS

| | | |
|---|---|---|
| 6,449,086 B1 | 9/2002 | Singh |
| 2008/0025943 A1 | 10/2008 | Shiraishi |
| 2009/0021496 A1 | 8/2009 | Nozawa |
| 2015/0014047 A1 | 1/2015 | Hutchison et al. |
| 2015/0301442 A1 | 10/2015 | Kageyama et al. |
| 2016/0019564 A1 | 7/2016 | Schicketanz |
| 2018/0035671 A1 | 12/2018 | Ikebe et al. |
| 2019/0019632 A1 | 6/2019 | Kim et al. |
| 2020/0000413 A1 | 1/2020 | Hsu et al. |

FOREIGN PATENT DOCUMENTS

| | | |
|---|---|---|
| CN | 104919537 A | 9/2015 |
| JP | 2009-272317 A | 11/2009 |
| JP | 2012208505 A | 10/2012 |
| JP | 2013514651 A | 4/2013 |
| JP | 2015215602 A | 12/2015 |
| JP | 2017-116931 A | 6/2017 |
| JP | 2017521712 A | 8/2017 |
| JP | 20185108 A | 1/2018 |
| KR | 1020010066881 A | 7/2001 |
| KR | 10-2017-0031200 A | 3/2017 |
| TW | 201428436 A | 7/2014 |
| TW | 201535040 A | 9/2015 |
| TW | 202001407 A | 1/2020 |
| WO | 2011073441 A2 | 6/2011 |
| WO | 2016 007396 A1 | 1/2016 |
| WO | 2016007396 A1 | 1/2016 |
| WO | 2017090485 A1 | 1/2017 |

OTHER PUBLICATIONS

Japanese Office Action dated Mar. 15, 2022 in counterpart Japanese application 2021-001369, 3 pages in Japanese.
Korean Office Action dated Jan. 15, 2021 in counterpart Korean application KR10-2020-0002546, 8 pages in Korean.
Japanese Office Action dated Nov. 24, 2021 in counterpart Japanese application 2021-001369, 4 pages in Japanese.
Taiwan Office Action dated Nov. 26, 2021 in counterpart Taiwan application 110100564, 6 pages in Chinese.
Korean Second Office Action dated Jul. 6, 2021 in counterpart Korean application KR10-2020-0002546, 8 pages in Korean.

*Primary Examiner* — Christopher G Young

(74) *Attorney, Agent, or Firm* — Juan Carlos A. Marquez; Marquez IP Law Office, PLLC

(57) ABSTRACT

Disclosed is a blankmask for EUV includes a substrate, a reflection film that is stacked on the substrate; and an absorbing film that is stacked on the reflection film. The reflection film has a structure in which a pair including a first layer made of Ru or a Ru compound in which one or more of Mo, Nb, and Zr are added to Ru, and a second layer made of Si is stacked plural times. Interdiffusion between the respective layers constituting the reflection film is suppressed.

19 Claims, 4 Drawing Sheets

REFLECTIVE TYPE BLANKMASK AND PHOTOMASK FOR EUV

CROSS-REFERENCE TO RELATED APPLICATION

This application is based on and claims priority under 35 U. S. C. § 119 to Korean Patent Application No. 10-2020-0002546, filed on Jan. 8, 2020, the disclosure of which is herein incorporated by reference in its entirety.

BACKGROUND

1. Field

The disclosure relates to a blankmask for extreme ultraviolet (hereinafter, EUV) that uses EUV light used in semiconductor manufacturing as exposure light.

2. Discussion of Related Art

In order to refine a semiconductor circuit pattern, the use of 13.5 nm of extreme ultraviolet (EUV) as exposure light is being pursued. In the case of a photomask for forming a circuit pattern on a substrate using the EUV, a reflective type photomask that reflects the exposure light and irradiates the reflected exposure light to a wafer is mainly used. FIG. 1 is a diagram illustrating an example of a reflective blankmask for manufacturing a reflective type photomask, and FIG. 2 is a diagram illustrating a photomask manufactured with the blankmask of FIG. 1.

As illustrated in FIG. 1, a reflective type blankmask for EUV is configured to include a substrate 102, a reflection film 104 formed on the substrate 102, an absorbing film 106 formed on the reflection film 104, and a resist film 108 formed on the absorbing film 106. The reflection film 104 is formed in a structure in which, for example, a molybdenum (Mo) layer made of a Mo material and a silicone (Si) layer made of a Si material are alternately stacked tens of times, and serves to reflect incident exposure light. The absorbing film 106 generally has a two-layer structure of a lower layer 106a made of a TaBN material and an upper layer 106b made of a TaBON material, and serves to absorb incident exposure light. The resist film 108 is used to pattern the absorbing film 106. As the absorbing film 106 is patterned into a predetermined shape, the blankmask is manufactured as a photomask, and the EUV exposure light incident on the photomask is absorbed or reflected according to the pattern of the absorbing film 106 and then irradiated onto a semiconductor wafer.

In the existing reflective type blankmask for EUV, the reflection film 104 has a problem in that a pair of the Mo layer and the Si layer is stacked in 40 to 60 layers, and therefore, interdiffusion occurs between the Mo layer and the Si layer. Specifically, the interdiffusion occurs between the Mo layer and the Si layer, and thus, a diffusion layer made of MoSi exists.

As main causes of the interdiffusion, there are heat applied during formation of each layer of the reflection film 104, heat applied to the reflection film 104 during coating of the resist film 108, heat energy applied to the reflection film 104 by the exposure light when the blankmask is used for a long time, and the like. FIG. 3 is a graph illustrating a phenomenon in which reflectance decreases due to the exposure light. Before the exposure is performed using EUV with a wavelength of 13.5 nm, that is, before the blankmask is used, the reflectance is about 67%, and after the blankmask is exposed to the exposure light above a certain level, that is, after the blankmask is used for a certain period of time, the reflectance is about 59%, so it can be seen that the decrease in reflectance of about 8% occurs.

As the interdiffusion proceeds, the reflectance of the reflection film 104 decreases, and as a result, the life of the blankmask is shortened. Therefore, there is a need for a method of preventing interdiffusion as much as possible to improve reflectance at the time of completion of manufacturing and to prevent a sharp decrease in reflectance due to use after manufacturing.

SUMMARY

The disclosure is to suppress interdiffusion between each layer constituting a reflection film in a blankmask for extreme ultraviolet (EUV) equipped with a multilayered reflection film, thereby providing a method of improving reflectance of the blankmask at the time of completion of manufacturing and preventing a decrease in reflectance due to use after manufacturing as much as possible.

According to an embodiment of the disclosure, a blankmask for EUV includes a substrate, a reflection film stacked on the substrate, and an absorbing film stacked on the reflection film. The reflection film may have a structure in which a pair including a first layer made of Ru or a Ru compound in which one or more of Mo, Nb, and Zr are added to Ru, and a second layer made of Si is stacked plural times.

The first layer may have a thickness of 1.5 to 3.2 nm, and the second layer may have a thickness of 3.8 to 5.5 nm.

In the one pair, the first layer and the second layer may have a thickness ratio of 0.22:0.78 to 0.44:0.56.

In the one pair, a sum of the thicknesses of the first layer and the second layer may be 6.8 to 7.1 nm.

The reflection film may be configured by stacking the pair 30 times or more, and a total thickness of the reflection film may be 200 nm or more.

The reflection film may be heat-treated after film formation.

The reflection film may have a reflectance of 60% or more with respect to EUV exposure light of 13.5 nm.

A surface flatness of the reflection film may have a TIR value of 1,000 nm or less.

The reflection film may have a surface roughness of 0.5 nm Ra or less.

An uppermost layer of the reflection film may be constituted by a protective film made of Si.

An intermediate layer may be formed on at least a portion between the respective layers constituting the reflection film. The intermediate layer may be made of any one of B, $B_4C$, and C.

The intermediate layer may be formed between the first layer and the second layer in the one pair. The intermediate layer may be formed between the pairs. The intermediate layer may be formed in either a lower region or an upper region of the reflection film.

The intermediate layer may have a thickness of 1 nm or less.

A capping film may be formed on the reflection film.

A conductive film may be formed on a backside of the substrate.

According to another embodiment of the disclosure, a photomask manufactured with the blankmask configured as described above is provided.

According to the disclosure, the interdiffusion between the respective layers forming the reflection film is suppressed in the blankmask for EUV having the multilayered reflection film. Accordingly, the reflectance of the blankmask is improved, and the decrease in reflectance due to the use after the manufacturing is prevented.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Hereinafter, the disclosure has been specifically described through the structure of the disclosure with reference to the accompanying drawings, but this structure is only used for the purpose of illustrating and explaining the disclosure, and is not used to limit the meaning or the scope of the disclosure described in the claims. Therefore, those having ordinary skill in the technical field of the disclosure can understand that various modifications and equivalent other embodiments are possible from the embodiments. Accordingly, an actual technical scope of the disclosure is to be defined by the spirit of the appended claims.

Figure 1:
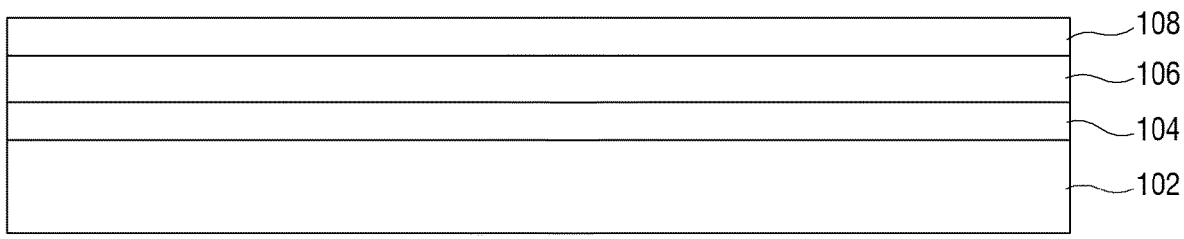
FIG. 1 is a diagram schematically illustrating a structure of a conventional general reflective type blankmask for EUV.
Figure 2:
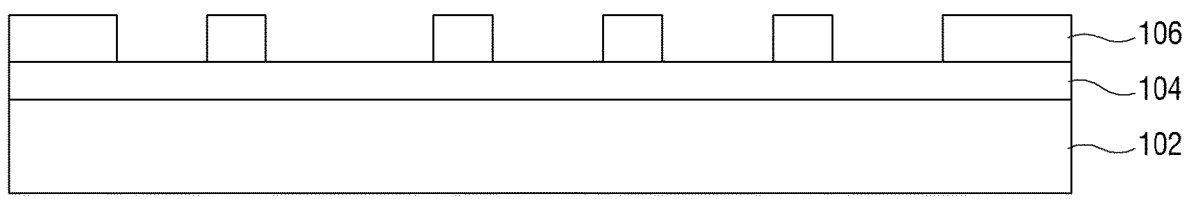
FIG. 2 is a diagram illustrating a photomask manufactured with the blankmask of FIG. 1.
Figure 3:
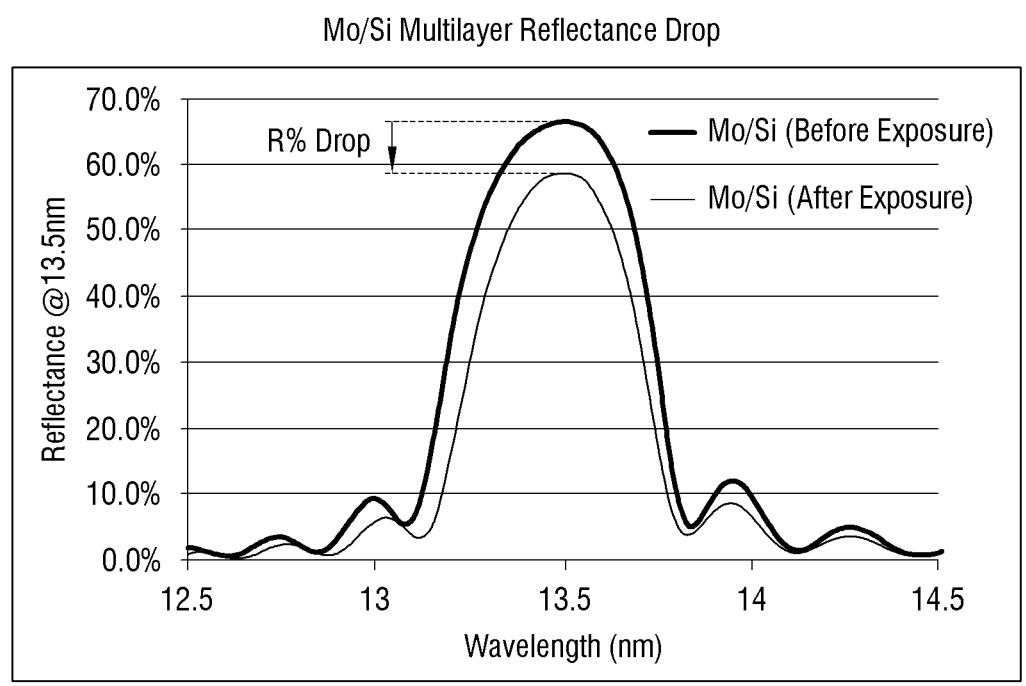
FIG. 3 is a graph illustrating a phenomenon in which reflectance decreases due to exposure light.
Figure 4:
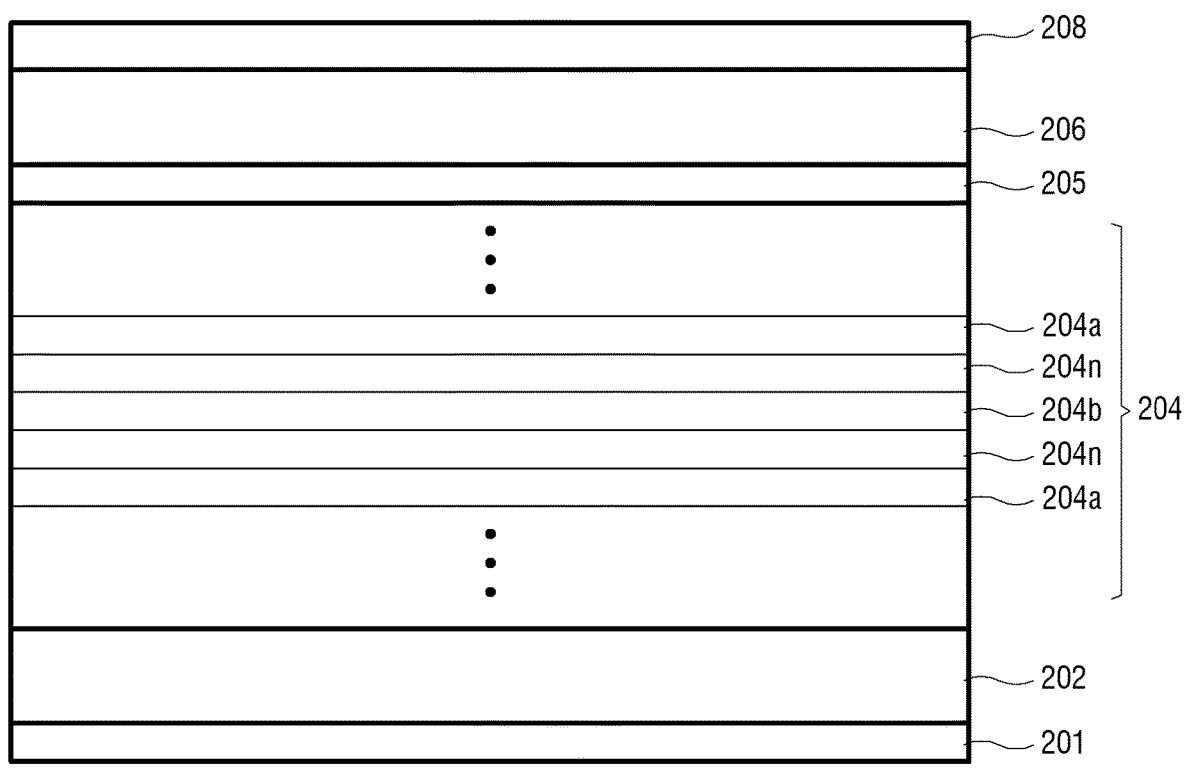
FIG. 4 is a diagram illustrating a structure of a reflective type blankmask for EUV according to the disclosure.

FIG. 4 is a diagram illustrating a structure of a reflective type blankmask for EUV according to the disclosure.

The reflective type blankmask for EUV according to the disclosure includes a substrate 202, a reflection film 204 formed on the substrate 202, an absorbing film 206 formed on the reflection film 204, and a resist film 208 formed on the absorbing film 206. In addition, the blankmask of the disclosure further includes a conductive film 201 formed on a backside of the substrate 202 and a capping film 205 formed between the reflection film 204 and the absorbing film 206.

The substrate 202 is a glass substrate for a reflective type blankmask using EUV exposure light, and is configured as a low thermal expansion material (LTEM) substrate having a low coefficient of thermal expansion within the range of $0\pm1.0\times10^{-7}/°$ C. and preferably $0\pm0.3\times10^{-7}/°$ C. in order to prevent deformation of a pattern due to heat and stress during exposure. As the material of the substrate 202, $SiO_2$—$TiO_2$-based glass, multi-component glass ceramic, or the like may be used.

The substrate 202 requires high flatness in order to increase accuracy of reflected light during the exposure. The flatness is represented by a total indicated reading (TIR) value, and it is preferable that the substrate 202 has a low TIR value. The flatness of the substrate 202 is 100 nm or less and preferably 50 nm or less in an area of 132 mm$^2$ or an area of 142 mm$^2$.

The reflection film 204 has a function of reflecting EUV exposure light, and has a multilayer structure having a different refractive index of each layer. Specifically, the reflection film 204 is formed by stacking a pair including a first layer 204a and a second layer 204b having different refractive indices 30 or more times, for example 40 to 60 times.

The first layer 204a is made of Ru or a Ru compound in which at least one element of Mo, Nb, and Zr is added to Ru, and the second layer 204b is made of Si. A film of the Ru material is less diffused by heat during the film formation, by heat during the coating of the resist film 208, and by the energy of the exposure light when exposed to the exposure light than a film of the Mo material. Therefore, the interlayer diffusion may be reduced by using the Ru material.

In one pair including the first layer 204a and the second layer 204b, the first layer 204a may have a thickness of 1.5 to 3.2 nm, and the second layer 204b may have a thickness of 3.8 to 5.5 nm. Preferably, the first layer 204a has a thickness of 2.0 to 2.8 nm, and the second layer 204b has a thickness of 4.2 to 5.0 nm. The reflection film 204 requires high reflectivity at a wavelength of 13.5 nm in order to improve the image contrast, and the reflection intensity of this multilayered reflection film varies depending on an incident angle of exposure light and a thickness of each layer. For example, when the incident angle of exposure light is 5 to 6°, it is preferable that the first layer 204a and the second layer 204b are formed to have a thickness of 2.4 nm and 4.5 nm, respectively.

In one pair including the first layer 204a and the second layer 204b, a thickness ratio of the first layer 204a and the second layer 204b sets an optimal range through a simulation of the reflectance of the reflection film 204. In consideration of this, the first layer 204a and the second layer 204b may have a thickness ratio of 0.22:0.78 to 0.44:0.56, and preferably have a thickness ratio of 0.3:0.7 to 0.4:0.6.

In one pair including the first layer 204a and the second layer 204b, the sum of the thicknesses of the first layer 204a and the second layer 204b is 6.8 to 7.1 nm, and preferably 6.9 to 7.0 nm. When the sum of the thicknesses is outside this range, the reflectance decreases sharply because the first and second layers 204a and 204b do not serve as a dielectric mirror.

It is preferable that the total thickness of the reflection film 204 is 200 nm or more. For example, one pair is 6.8 nm, and such a pair may be stacked 30 times to be 204 nm.

Meanwhile, the reflection film 204 may be heat-treated using RTP, furnace, hot-plate, or the like after the film formation. When the heat treatment is performed, the stress of the reflection film 204 increases, and thus, the flatness of the reflection film is improved.

The reflection film 204 has a reflectance of 60% or more and preferably a reflectance of 65% or more with respect to EUV exposure light of 13.5 nm. When the surface flatness of the reflection film 204 is represented by the TIR value, the TIR has a value of 1,000 nm or less, preferably 500 nm or less, and more preferably 300 nm or less. When the surface flatness of the reflection film 204 is 1000 nm or more, a pattern position error occurs.

The reflection film 204 has a surface roughness of 0.5 nm Ra or less, preferably 0.3 nm Ra or less, and more preferably 0.1 nm Ra or less in order to suppress diffuse reflection of the EUV exposure light.

Meanwhile, it is preferable that an uppermost layer of the reflection film 204 is constituted by a protective film made of a Si material. The protective film serves to prevent the reflection film from being oxidized.

An intermediate layer 206c is interposed between the respective layers 204a and 204b of the reflection film 204. An intermediate layer 204n may be made of any one of B, $B_4C$, and C. The intermediate layer 204n serves to prevent interdiffusion between the respective layers 204a and 204b by blocking direct contact between the layers 204a and 204b.

It is preferable that the intermediate layer 204n has a thickness of 1 nm or less. When the thickness of the intermediate layer 204n is 1 nm or more, the decrease in the reflection film 204 with respect to EUV exposure light may occur.

In the embodiment of FIG. 4, the intermediate layer 204n may be made of different materials for each layer. For example, B is used as the material of the intermediate layer 206n between the first layer 204a of the Ru material and the second layer 204b of a Si material above the first layer 204a, and C may be used as a material of the intermediate layer 204n between the second layer 204b of the Si material and the first layer 204a of the Ru material above the second layer 204b.

In FIG. 4, the intermediate layer 204n is formed between all the layers constituting the reflection film 204. However, since the intermediate layer 204n may cause the decrease in reflectance of the reflection film 204, the intermediate layer 204n may be formed only between some layers, not between all layers in order to prevent the reflectance from decreasing.

As an example, the intermediate layer 204n may be formed only between the first layer 204a and the second layer 204b in one pair, and may not be formed between the respective pairs. In this case, for the reflection film 204, for example, one set stacked in the order of Ru/B/Si from the bottom to the top is repeatedly stacked.

As another example, the intermediate layer 204n may be formed only between the second layer 204b in one pair and the first layer 204a in the pair above the second layer 204b. In this case, for the reflection film 204, for example, one set stacked in the order of Ru/B/Si from the bottom to the top is repeatedly stacked.

As another example, the intermediate layer 204n may be formed only in 10 pairs of the upper region or 10 pairs of the lower region of the reflection film 204 among the Ru/Si pairs.

The capping film 205 is formed on the reflection film 204, and serves to protect the reflection film 204 thereunder during a dry etching process or a cleaning process for patterning the absorbing film 206. To this end, the capping film 205 is made of at least any one of Ru and Nb, or at least any one of a Ru compound and an Nb compound in which any one or more of C, N, and O is contained in Ru or Nb. At this time, it is preferable that the main element, Ru or Nb has a content of 60 at % or more. In addition, the capping film 205 preferably has an etching selectivity of 10 or more with respect to a layer in contact with the capping film 205 in the absorbing film 206 thereon, that is, the lowermost layer in the absorbing film 206, and more preferably has an etching selectivity of 20 or more. When the etching selectivity is large, the capping film 205 is prevented from being etched during the patterning process of the absorbing film 206 thereon, so the reflection film 204 thereunder may be appropriately protected.

The capping film 205 has a thickness of 1 to 10 nm, and preferably a thickness of 1 to 5 nm. When the thickness of the capping film 205 is 1 nm or less, it is difficult to protect the reflection film 204 formed thereunder when the etching conditions (for example, over etching, and the like) are considered during the patterning process of the absorbing film 206. When the thickness of the capping film 205 is 10 nm or more, the reflectance of the exposure light of 13.5 nm is attenuated, resulting in a problem that the image contrast decreases.

The absorbing film 206 is formed on the capping film 205 and serves to absorb the exposure light. Specifically, the absorbing film 206 has a reflectance of 10% or less and preferably a reflectance of 1 to 8% with respect to EUV exposure light having a wavelength of 13.5 nm, and thus absorbs most of the exposure light. The absorbing film 206 has a thickness of 50 nm or less, and preferably has a thickness of 40 nm or less. The absorbing film 206 may be made of a material such as TaN and TaBN.

The resist film 208 is made of a chemically amplified resist (CAR). The resist film 208 has a thickness of 150 nm or less and preferably 100 nm or less.

The conductive film 201 is formed on the backside of the substrate 202. The conductive film 201 has a lower sheet resistance value to serve to improve adhesion between an electronic-chuck and the blankmask for EUV, and prevent particles from being generated due to friction with the electronic-chuck. The conductive film 201 has a sheet resistance of 100Ω/□ or less, preferably 50Ω/□ or less, and more preferably 20Ω/□ or less. The conductive film 201 may be configured in the form of a single film, a continuous film, or a multilayer film. The conductive film 201 may be made of, for example, Cr as a main component, and when the conductive film 201 is constituted by a two-layer multilayer film, the lower layer may contain Cr and N, and the upper layer may contain Cr, N, and O.

Hereinafter, specific implementation examples and comparative examples of the disclosure will be described.

Implementation Example

A conductive film 201 having a two-layer structure of a lower layer and an upper layer mainly made of Cr was formed on a backside of a $SiO_2$—$TiO_2$-based substrate 202 using DC magnetron reactive sputtering equipment. The conductive film of the upper and lower layers was formed using a Cr target. The conductive film of the lower layer was constituted by a CrN film having a thickness of 51 nm by injecting $Ar:N_2$=5 sccm:5 sccm as a process gas and using a process power of 1.4 kW. The conductive film of the upper layer was constituted by a CrN film having a thickness of 15 nm by injecting $Ar:N_2:NO$=7 sccm:7 sccm:7 sccm as a process gas and using a process power of 1.4 kW. As a result of measuring the sheet resistance of the conductive film 201 using a 4-point probe, it was confirmed that there is no problem in bonding with the electro-static chuck and there is no problem in use as the conductive film by showing a sheet resistance value of 22.6 Ω/□.

A 30-layer reflection film 204 was formed by alternately stacking a Ru layer and a Si layer on the entire surface of the substrate 202 on which the conductive film 201 was formed. The multilayered reflection film 204 was formed by mounting Mo and Si targets on ion beam deposition-low defect density (IBD-LDD) equipment and then alternately forming the Ru and Si layers in an Ar gas atmosphere. Specifically, the reflection film 204 was formed by first forming a Ru layer at 2.4 nm, a Si layer at 4.5 nm, and repeating 30 cycles of the Ru layer and the Si layer as one cycle.

As a result of measuring the reflectance of the multilayered reflection film 204 at 13.5 nm using EUV reflectometer equipment, the reflectance was 66.8%, and as a result of measuring a stress of a thin film using ultra-flat equipment, TIR was 585 nm. Thereafter, as a result of measuring a surface roughness using AFM equipment, the surface roughness was 0.321 nm Ra.

A capping film 205 that has a thickness of 2.5 nm and is made of RuN was formed on the multilayered reflection film 204 in a nitrogen atmosphere by using IBD-LDD equipment and using a Ru target. As a result of measuring the reflectance in the same manner as the multilayered reflection film after the formation of the capping film, it was confirmed that the reflectance is 65.1% at a wavelength of 13.5 nm, and therefore, there is almost no loss of reflectance.

An absorbing film 206 having a two-layer structure was formed on the capping film 205 using DC magnetron sputtering equipment. Specifically, the lower layer of the absorbing film 206 constituted by a TaN film having a thickness of 50 nm was formed on the capping film 205 by using a Ta target, injecting $Ar:N_2$=9 sccm:1 sccm as a process gas, and using a process power of 0.62 kW. Thereafter, the upper layer of the absorbing film 206 constituted by a TaON film having a thickness of 2 nm was formed by using the same target, injecting $Ar:N_2$:NO=3 sccm:20 sccm:4.5 sccm as a process gas, and using a process power of 0.62 kW.

The absorbing film 206 manufactured in a two-layer stacked structure showed a reflectance of 2.6% at a wavelength of 13.5 nm. As a result, it was determined that the reflectance can be controlled to be in the range of 1 to 10% by adjusting the thickness of the two-layer structure of the absorbing film 206.

The resist film 208 was spin coated on the absorbing film 206 to a thickness of 100 nm to complete the manufacturing of the blankmask for EUV.

Comparative Example

Comparative Example is the same as the Implementation Example described above except that a reflection film 204 is configured in a stacked structure of 40 cycles of Mo/Si.

The reflection film was formed by mounting a Mo target and a Si target in the IBD-LDD equipment and then alternately forming a Mo layer and a Si layer in an Ar gas atmosphere. At this time, the Mo layer was first formed to a thickness of 2.8 nm, and the Si layer was formed to a thickness of 4.2 nm.

As a result of measuring the reflectance of the reflection film 204 at 13.5 nm using EUV reflectometer equipment, the reflectance was 67.8%, and as a result of measuring a stress of a thin film using ultra-flat equipment, TIR was 625 nm. Thereafter, as a result of measuring a surface roughness using AFM equipment, the surface roughness was 0.125 nm Ra.

Thereafter, a capping film 205 that has a thickness of 2.5 nm and is made of RuN was formed on the reflection film in a nitrogen atmosphere by using IBD-LDD equipment and using a Ru target. After forming the capping film 205, as a result of measuring the reflectance in the same manner as the reflection film 204, the reflectance was 65.4% at a wavelength of 13.5 nm.

An absorbing film 206 having the same structure and a resist film 208 were formed on the reflection film 204 to complete the manufacturing of the blankmask for EUV.

Heat Treatment Evaluation Result

After heat treatment was performed on the multilayered reflection film manufactured according to the above-described implementation example and comparative example, the change in reflectance was evaluated as follows.

TABLE 1

| | Before R % @ 13.5 nm | Heat Treatment (350 * 10 min) | After R % @ 13.5 nm | Delta R % @ 13.5 nm |
|---|---|---|---|---|
| Implementation Example | 65.1% | 350° C. * 10 minutes | 64.8% | −0.3% |
| Comparative Example | 65.4% | 350° C. * 10 minutes | 58.2% | −7.2% |

As a result of the evaluation, according to the implementation example, the reflection film made of Ru/Si showed a low change in reflectance after subjected to the heat treatment, but according to the comparative example, the reflection film made of Mo/Si showed the sharp decrease in reflectance after subjected to the heat treatment.

What is claimed is:

1. A blankmask for EUV, comprising:
a substrate;
a reflection film stacked on the substrate; and
an absorbing film stacked on the reflection film,
wherein the reflection film has a structure in which a pair including a first layer made of Ru or a Ru compound in which one or more of Mo, Nb, and Zr are added to Ru, and a second layer made of Si is stacked plural times.

2. The blankmask for EUV of claim 1, wherein the first layer has a thickness of 1.5 to 3.2 nm, and the second layer has a thickness of 3.8 to 5.5 nm.

3. The blankmask for EUV of claim 1, wherein in the one pair, the first layer and the second layer have a thickness ratio of 0.22:0.78 to 0.44:0.56.

4. The blankmask for EUV of claim 1, wherein in the one pair, a sum of the thicknesses of the first layer and the second layer is 6.8 to 7.1 nm.

5. The blankmask for EUV of claim 1, wherein the reflection film is configured by stacking the pair 30 times or more, and
a total thickness of the reflection film is 200 nm or more.

6. The blankmask for EUV of claim 1, wherein the reflection film is heat-treated after film formation.

7. The blankmask for EUV of claim 1, wherein the reflection film has a reflectance of 60% or more with respect to EUV exposure light of 13.5 nm.

8. The blankmask for EUV of claim 1, wherein a surface flatness of the reflection film has a TIR value of 1,000 nm or less.

9. The blankmask for EUV of claim 1, wherein the reflection film has a surface roughness of 0.5 nm Ra or less.

10. The blankmask for EUV of claim 1, wherein an uppermost layer of the reflection film is constituted by a protective film made of Si.

11. The blankmask for EUV of claim 1, wherein an intermediate layer is formed on at least a portion between the respective layers constituting the reflection film.

12. The blankmask for EUV of claim 11, wherein the intermediate layer is made of any one of B, $B_4C$, and C.

13. The blankmask for EUV of claim 11, wherein the intermediate layer is formed between the first layer and the second layer in the one pair.

14. The blankmask for EUV of claim 11, wherein the intermediate layer is formed between the pairs.

15. The blankmask for EUV of claim 11, wherein the intermediate layer is formed in either a lower region or an upper region of the reflection film.

16. The blankmask for EUV of claim 11, wherein the intermediate layer has a thickness of 1 nm or less.

17. The blankmask for EUV of claim 1, further comprising:
a capping film formed on the reflection film.

18. The blankmask for EUV of claim 1, further comprising:
a conductive film formed a backside of the substrate.

19. A photomask manufactured with the a blankmask for EUV, the blankmask comprising:
a substrate;
a reflection film stacked on the substrate; and
an absorbing film stacked on the reflection film,
wherein the reflection film has a structure in which a pair including a first layer made of Ru or a Ru compound in which one or more of Mo, Nb, and Zr are added to Ru, and a second layer made of Si is stacked plural times.

* * * * *